United States Patent
Lee et al.

(10) Patent No.: US 11,825,599 B2
(45) Date of Patent: Nov. 21, 2023

(54) AIR-POCKET PREVENTION PCB, AIR-POCKET PREVENTION PCB MODULE, ELECTRICAL DEVICE INCLUDING THE SAME, AND MANUFACTURING METHOD OF ELECTRICAL DEVICE INCLUDING THE SAME

(71) Applicant: SOLUM CO., LTD., Gyeonggi-Do (KR)

(72) Inventors: Jun Kyu Lee, Gyeonggi-do (KR); Jeong Man Han, Gyeonggi-do (KR); Su Young Kim, Gyeonggi-Do (KR); Yong Woo Kang, Gyeonggi-Do (KR); Sang Keun Ji, Gyeonggi-Do (KR); Dong Kyun Ryu, Seoul (KR)

(73) Assignee: SOLUM CO., LTD., Gyeonggi-Do (KR)

(*) Notice: Subject to any disclaimer, the term of this patent is extended or adjusted under 35 U.S.C. 154(b) by 43 days.

(21) Appl. No.: 17/500,654

(22) Filed: Oct. 13, 2021

(65) Prior Publication Data
US 2022/0183145 A1  Jun. 9, 2022

(30) Foreign Application Priority Data
Dec. 9, 2020 (KR) .......................... 10-2020-0171228

(51) Int. Cl.
*H05K 1/02* (2006.01)
*H05K 1/09* (2006.01)
(Continued)

(52) U.S. Cl.
CPC ............. *H05K 1/0272* (2013.01); *H05K 3/34* (2013.01); *H05K 2201/09063* (2013.01)

(58) Field of Classification Search
CPC ...... H05K 1/02; H05K 1/0272; H05K 1/0298; H05K 1/09; H05K 1/16; H05K 3/28;
(Continued)

(56) References Cited

U.S. PATENT DOCUMENTS 4,143,456 A * 3/1979 Inoue .................... H01L 21/563
29/841
4,644,445 A * 2/1987 Sakuma ................ H01L 21/563
361/779
(Continued)

FOREIGN PATENT DOCUMENTS

EP      3139715 A1     3/2017
JP    2002-203425 A    7/2002
(Continued)

OTHER PUBLICATIONS

European Search Report from EP Application No. 21212431.7 dated May 2, 2022.

*Primary Examiner* — Xiaoliang Chen
(74) *Attorney, Agent, or Firm* — Ladas & Parry, LLP

(57) ABSTRACT

The present invention relates to an electrical device including a printed circuit board (PCB) accommodated in a case, and more particularly, to an air-pocket prevention PCB, an air-pocket prevention PCB module, an electrical device including the same, and a manufacturing method of an electrical device including the same with improved fluidity of a resin material so that air pockets that may occur when the case is filled with the resin material are easily discharged and the resin material may be evenly filled inside the case.

13 Claims, 11 Drawing Sheets

(51) Int. Cl.
| | |
|---|---|
| *H05K 1/16* | (2006.01) |
| *H05K 3/28* | (2006.01) |
| *H05K 3/30* | (2006.01) |
| *H05K 3/34* | (2006.01) |
| *H05K 5/02* | (2006.01) |
| *H05K 7/00* | (2006.01) |
| *H01L 21/56* | (2006.01) |
| *H01L 21/60* | (2006.01) |
| *H01L 23/00* | (2006.01) |
| *H01L 23/04* | (2006.01) |
| *H01L 23/053* | (2006.01) |
| *H01L 23/055* | (2006.01) |
| *H01L 23/18* | (2006.01) |
| *H01L 23/31* | (2006.01) |
| *H01L 23/48* | (2006.01) |
| *H01L 23/498* | (2006.01) |
| *H01L 33/48* | (2010.01) |
| *H01L 33/50* | (2010.01) |
| *H01L 33/56* | (2010.01) |
| *H01L 33/58* | (2010.01) |
| *H01M 10/42* | (2006.01) |

(58) Field of Classification Search
CPC ............ H05K 3/30; H05K 3/34; H05K 3/284; H05K 5/02; H05K 7/00; H05K 2201/09063; H05K 2201/10719; H01L 21/56; H01L 21/60; H01L 21/204; H01L 23/00; H01L 23/04; H01L 23/053; H01L 23/055; H01L 23/18; H01L 23/31; H01L 23/48; H01L 23/459; H01L 23/488; H01L 23/498; H01M 10/42; H01M 10/425
USPC .... 361/760, 748, 751, 752, 758; 257/77, 91, 257/200, 687, 698, 730, 737, 777, 778; 429/7
See application file for complete search history.

(56) References Cited

U.S. PATENT DOCUMENTS

| | | | | |
|---|---|---|---|---|
| 5,670,797 A * | 9/1997 | Okazaki | ................ | H01L 33/486 257/669 |
| 5,729,437 A * | 3/1998 | Hashimoto | ....... | H01L 23/49805 439/219 |
| 5,832,600 A * | 11/1998 | Hashimoto | ............. | H01L 21/56 29/841 |
| 6,410,127 B1 * | 6/2002 | Kamae | ................... | C08G 59/18 528/421 |
| 7,355,278 B2 * | 4/2008 | Shibata | ................. | H01L 21/565 257/730 |
| 2002/0063264 A1 * | 5/2002 | Noshita | ................. | H01L 23/562 257/200 |
| 2002/0086782 A1 * | 7/2002 | Borger | ................... | B65H 27/00 492/56 |
| 2005/0037537 A1 * | 2/2005 | Kim | .................... | H01L 21/6836 257/E21.705 |
| 2008/0035895 A1 * | 2/2008 | Ogi | ........................ | H01B 1/02 252/514 |
| 2009/0059498 A1 * | 3/2009 | Jeong | ..................... | H05K 3/284 361/748 |
| 2009/0120675 A1 * | 5/2009 | Sakatani | ............... | H01L 21/563 29/832 |
| 2009/0273071 A1 * | 11/2009 | Kudose | ................. | H01L 21/563 257/692 |
| 2009/0321920 A1 * | 12/2009 | Sakurada | ................ | H01L 24/97 257/E23.011 |
| 2010/0019394 A1 * | 1/2010 | Kudose | ................... | H01L 23/13 257/E21.511 |
| 2011/0176346 A1 * | 7/2011 | Katamura | ............. | H01L 25/165 365/51 |
| 2011/0291295 A1 * | 12/2011 | Isa | ....................... | H01L 25/0657 257/777 |
| 2012/0021568 A1 * | 1/2012 | Mino | .................. | H01L 23/3135 257/E21.502 |
| 2012/0080786 A1 * | 4/2012 | Furutani | ........... | H01L 21/76804 257/737 |
| 2013/0323536 A1 * | 12/2013 | Hur | ..................... | H01M 50/183 429/7 |
| 2013/0329384 A1 * | 12/2013 | Kanno | ................ | F16H 61/0006 361/752 |
| 2014/0138706 A1 * | 5/2014 | Yoneyama | .............. | H01L 23/13 257/676 |
| 2016/0261059 A1 * | 9/2016 | Kanzaki | ................... | H05K 1/09 |
| 2018/0138160 A1 * | 5/2018 | Imai | ..................... | H01L 33/507 |
| 2018/0158998 A1 * | 6/2018 | Imai | ..................... | H01L 33/58 |
| 2019/0358859 A1 * | 11/2019 | Izumi | .................... | G01L 19/145 |
| 2020/0012086 A1 * | 1/2020 | Kawahara | ............ | G02B 23/2469 |
| 2020/0075437 A1 * | 3/2020 | Nozu | .................... | H01L 25/167 |
| 2020/0194645 A1 * | 6/2020 | Takojima | .................. | F21S 4/24 |
| 2020/0303439 A1 * | 9/2020 | Shimizu | .................. | H01L 24/48 |

FOREIGN PATENT DOCUMENTS

| | | |
|---|---|---|
| JP | 2009071110 A | 4/2009 |
| WO | WO 2011/029755 A1 | 3/2011 |
| WO | WO 2015/029219 A1 | 3/2015 |

* cited by examiner

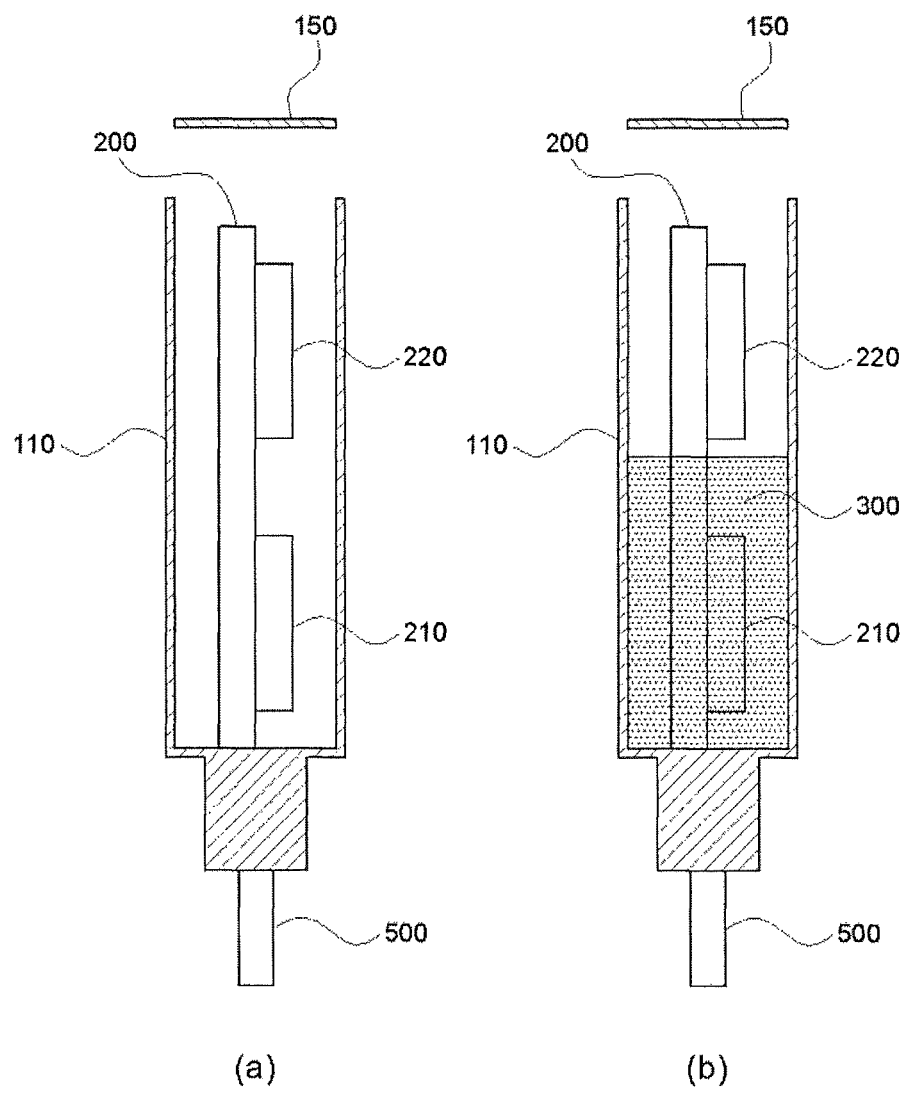

AIR-POCKET PREVENTION PCB, AIR-POCKET PREVENTION PCB MODULE, ELECTRICAL DEVICE INCLUDING THE SAME, AND MANUFACTURING METHOD OF ELECTRICAL DEVICE INCLUDING THE SAME

CROSS-REFERENCE TO RELATED APPLICATIONS

This application claims priority under 35 U.S.C. § 119 to Korean Patent Application No. 10-2020-0171228, filed on Dec. 9, 2020, in the Korean Intellectual Property Office, the disclosure of which is incorporated herein by reference in its entirety.

TECHNICAL FIELD

The following disclosure relates to an electrical device including a printed circuit board (PCB) accommodated in a case, and more particularly, to an air-pocket prevention PCB, an air-pocket prevention PCB module, an electrical device including the same, and a manufacturing method of an electrical device including the same with improved fluidity of a resin material so that air pockets that may occur when the case is filled with the resin material are easily discharged and the resin material may be evenly filled inside the case.

BACKGROUND

Electrical devices are trending toward miniaturization, weight reduction, and large capacity day by day. In particular, chargers for charging mobile devices have high demands for miniaturization, weight reduction, and large capacity. Hereinafter, the description is made based on the charger as a representative of the electrical devices. However, the rights of the present invention are not limited to the charger.

In recent years, due to large capacity of the mobile devices and an increase in power consumption, it is required to increase a capacity of a battery, which is a power source of the mobile device, and to shorten a charging time. When an output capacity of the charger is increased to satisfy such requirement, the amount of heat generated increases. General electrical devices use a case as a heat sink to dissipate internal heat to the outside, thereby lowering a temperature of internal components. In the case of the electrical devices such as the chargers, where a user may be in contact with the case, there is a limitation in using the case as the heat sink because it is required to lower a temperature of a surface of the case that the user is in contact with and keep it below a certain level (for example, 60 degrees Celsius) in order to prevent low-temperature burns of the user.

Conventional chargers have a sufficiently large size to dissipate heat by using an internal natural convection phenomenon. However, such a conventional charger has a problem in that the internal components of the charger are continuously exposed to an over-temperature, and the components that are continuously exposed to the over-temperature for a long time may shorten a lifespan, may cause malfunction, or may be damaged. Furthermore, in the case in which the capacity of the charger is further increased and the size of the charger is reduced, since the amount of heat generated by the internal components increases, an interval between the internal components and a space between the internal components and the case are reduced, a problem that the internal temperature is excessively increased becomes more serious, there is a problem that it is difficult to achieve an increase in capacity and miniaturization of the charger.

In addition, in case of dissipating heat by filling the case with a resin material with high thermal conductivity in the miniaturized charger, since the space between the components and the PCB and the case is narrow, it is not easy to insert the resin material into an injection nozzle. Therefore, there is a problem in that it is difficult to evenly inject the resin material into the case.

In addition, in the case of assembling the components and the PCB by first injecting a resin material with high thermal conductivity into the case where the components and the PCB are not assembled, and then inserting the components and the PCB into the case in order to solve the above-mentioned problem, since the components and the PCB are assembled in a state in which contact portions between electrical terminals provided inside the case and the components and the PCB are immersed in the resin material or has the resin material embedded thereon, there is a problem in that contact failure may occur due to a resin material at the contact portions between the components and the PCB and the terminals.

In addition, there was a problem in that a heat dissipation performance may be deteriorated because air pockets are likely to occur between the components and the PCB and the resin material.

In addition, in order to satisfy the criterion that the charger should not have trouble when it drops from a predetermined height, the charger should be light and should be able to protect the internal components and the PCB even from a drop impact. However, there is a problem in that it is difficult to reduce the size and weight of the charger because a support member for fixing and protecting the components and the PCB needs to be additionally provided.

In addition, there is a problem in that it is difficult to secure a separation distance between the components for securing electrical insulation between the components provided therein as the size of the charger decreases.

SUMMARY

An embodiment of the present invention is directed to providing an air-pocket prevention printed circuit board (PCB), an air-pocket prevention PCB module, an electrical device including the same, and a manufacturing method of an electrical device including the same that easily discharge air pockets generated when a case is filled with a resin material and improve fluidity of resin material by configuring the resin material or air contained in the resin material to penetrate and flow through one surface and the other surface of a PCB module, in the electrical device configured to dissipate heat of the PCB module accommodated in the case through the resin material filled in the case.

In one general aspect, an air-pocket prevention printed circuit board (PCB) in which at least a portion of a PCB is provided at a position immersed in a resin material in a state in which one end and the other end of the PCB are placed upward and downward with respect to a ground, respectively, and are perpendicular to the ground, includes: a solder bonding portion for welding-soldering a plurality of components; and a passage portion including a plurality of through holes through which the resin material having a higher viscosity than water passes, wherein at least one of the plurality of through holes is provided on a first region of the PCB, which is a region immersed in the resin material, or an air-pocket prevention printed circuit board (PCB) in which one end and the other end of the PCB are positioned opposite to each other and a portion of the PCB is provided at a position immerged in a resin material, includes: a solder bonding portion for welding-soldering a component; and a passage portion including a through hole, wherein the through hole is provided on a first region immerged in the resin material and adjacent to the other end of the PCB, and the through hole is spaced apart from a periphery of the PCB and penetrates through the PCB.

The viscosity of the resin material may be 2,000 mPa-sec or more and 40,000 mPa-sec or less.

The through hole may have a larger cross-sectional area as it is closer to the other end of the PCB (an end portion in a negative direction of a Z axis).

The passage portion may include the more through holes as it is closer to the other end (an end portion in a negative direction of a Z axis).

The through hole may have a shape of any one of polygonal, circular, gourd bottle, and elliptical.

The through hole may be formed in the form of a closed curve on the PCB, or in the form in which one side is opened.

In another general aspect, an air-pocket prevention PCB module includes: the air-pocket prevention PCB described above; and a plurality of components mounted on the solder bonding portion, wherein the amount of heat generation of a lower component group mounted on the other end side (a negative direction of a Z axis) of the PCB in the PCB module among the components is greater than the amount of heat generation of an upper component group mounted on one end side (a positive direction of the Z axis) of the PCB in the PCB module, the amount of heat generation of components provided in the first region, which is a region immersed in the resin material, is greater than the amount of heat generation of components provided outside the first region, the plurality of components include a first component and a second component, the first component is disposed on the first region of the PCB, the second component is disposed on a second region of the PCB other than the first region, and the amount of heat generation of the first component is greater than the amount of heat generation of the second component.

As a height of the component adjacent to the through hole on the PCB increases (as a length in a direction perpendicular to a surface of the PCB is longer), the number per unit area of the through hole may increase or a cross-sectional area of the through hole may increase, the first component may be disposed on one side of the through hole, and as a height of the first component increases, the cross-section area of the through hole may increase.

When the component is a surface-mounted component, the through hole may be provided to be closer to the other end direction (the negative direction of the Z axis) of the PCB than the component, and the through hole may be disposed between the first component and the other end of the PCB.

The lowermost end of the through hole may be formed to be closer to the other end direction (the negative direction of the Z axis) of the PCB than the lowermost end of the corresponding component mounted on the PCB module, the uppermost end of the through hole may be formed to be closer to an upper end direction (the positive direction of the Z axis) of the case than the lowermost end of the corresponding component, and a portion of the first component may overlap the through hole.

The lowermost end and the uppermost end of the through hole may be formed to be closer to the other end side (the negative direction of the Z axis) and one end side (the positive direction of the Z axis) than the lowermost end of the component provided at a position corresponding to the through hole, respectively.

When a height of a first component mounted on either surface of the PCB is H1, a separation distance from the nearest through hole is D1, a height of a second component mounted on the other surface of the PCB is H2, and a separation distance from the nearest through hole is D2, if H1≥H2, then D1<D2, and the PCB may include a first surface and a second surface opposing each other, the first component may be disposed on the first surface of the first region of the PCB, the second component may be disposed on the second surface of the first region of the PCB, the first and second components may be disposed on one side of the through hole, respectively, a first height of the first component may be equal to or greater than a second height of the second component, and the first component may be disposed closer to the through hole than the second component.

At least one of the plurality of components may have a lower surface (an end portion in the negative direction of the Z axis) of the component inclined toward one end side (the positive direction of the Z axis) of the PCB as is further away from the surface of the PCB in a direction (a direction of a Y axis) perpendicular to the PCB, and as another example, the first component may be disposed on one side of the through hole, the first component may have a side surface that intersects with one surface of the PCB on which the first component is mounted and is adjacent to the through hole, and the side surface of the first component may have an obtuse angle with respect to one surface of the PCB disposed between the side surface of the first component and the through hole.

The PCB module may further include an air-pocket prevention reinforcing agent having one end portion connected to the PCB and the other end portion connected to at least a portion of the lower surface (an end portion in the negative direction of the Z axis) of the component, the other end portion being inclined toward one end portion (the positive direction of the Z axis) of the PCB compared to one end portion, and one surface of the reinforcing agent may have an obtuse angle with respect to the one surface of the PCB disposed between the reinforcing agent and the through hole.

The air-pocket prevention reinforcing agent may include at least one of a resin, polycarbonate (PC), and lead.

The components may include a third component 240 soldered to the PCB through a plurality of leg portions disposed to be spaced apart from each other in a vertical direction (Z axis direction) so as to be mounted to be spaced apart from the PCB, and an upper end 420 of the through hole corresponding to the third component may be formed to be closer to an upper end direction (the positive direction of the Z axis) of the case than a lower end 242*b* of the leg portion disposed at the uppermost end among the leg portions, and as another example, the first component may include a body portion disposed on the PCB; and a first leg portion and a second leg portion interposed between the body portion and the PCB and spaced apart from each other, and a portion of the first leg portion may overlap the through hole, and the second leg portion may be disposed between the through hole and the other end of the PCB.

A component having the through hole in the other end direction (the negative direction of the Z axis) of the PCB or the first component may include at least one of a transformer, a coil, a fuse, a varistor, and a capacitor. That is, the through hole may be formed below (the negative direction of the Z axis) the transformer, the coil, the fuse, the varistor, or the capacitor among the components.

The maximum allowable temperature of the components provided in the first region may be lower than the maximum allowable temperature of any one of the components provided outside the first region.

The weight of the heaviest component among the components provided in the first region may be heavier than the weight of the heaviest component among the components provided outside the first region.

In another general aspect, an electrical device includes a case having an internal space; a filler filled into at least a portion of the internal space and formed of a resin material; and the air-pocket prevention PCB module accommodated in the internal space.

In another general aspect, a manufacturing method of the electrical device includes: (a) preparing a case; (b) forming a filler by injecting a rein material into an internal space of the case; (c) assembling the PCB module by slidably inserting the PCB module downward into the internal space of the case in which the filler is formed; and (e) curing the resin material by maintaining the case in which the filler is formed at a predetermined temperature or higher.

The assembling of the PCB module (c) may further include applying vibration to the case when or after assembling the PCB module.

The assembling of the PCB module (c) may further include tilting the case at a predetermined angle when or after assembling the PCB module.

In another general aspect, a manufacturing method of the electrical device includes: (a) preparing a case; (b) assembling the PCB module by slidably inserting the PCB module downward into the internal space of the case; (c) forming a filler by injecting a rein material into an internal space of the case in which the PCB module is assembled; and (d) curing the resin material by maintaining the case in which the filler is formed at a predetermined temperature or higher.

The forming of the filler (c) may further include applying vibration to the case when or after injecting the resin material.

The forming of the filler (c) may further include tilting the case at a predetermined angle when or after injecting the resin material.

BRIEF DESCRIPTION OF THE DRAWINGS

FIG. 11 is a schematic cross-sectional view of a manufacturing method of an electrical device according to the second embodiment of the present invention.

DETAILED DESCRIPTION OF EMBODIMENTS

Hereinafter, an embodiment of the present invention will be described in detail with reference to the accompanying drawings.

Figure 1:
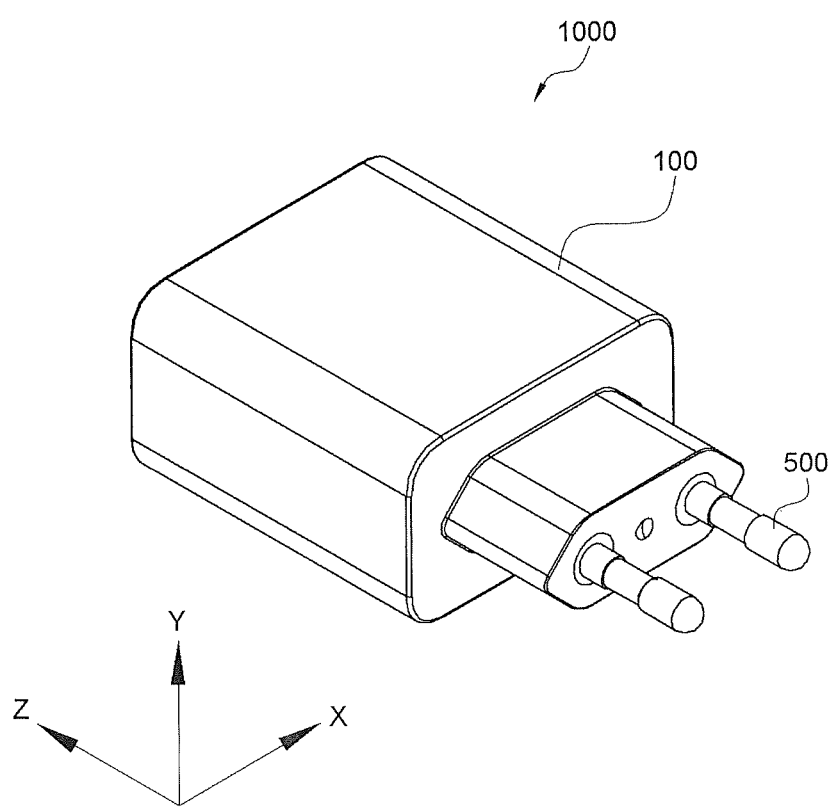
FIG. 1 is a perspective view of an electrical device according to an embodiment of the present invention.
Figure 2:
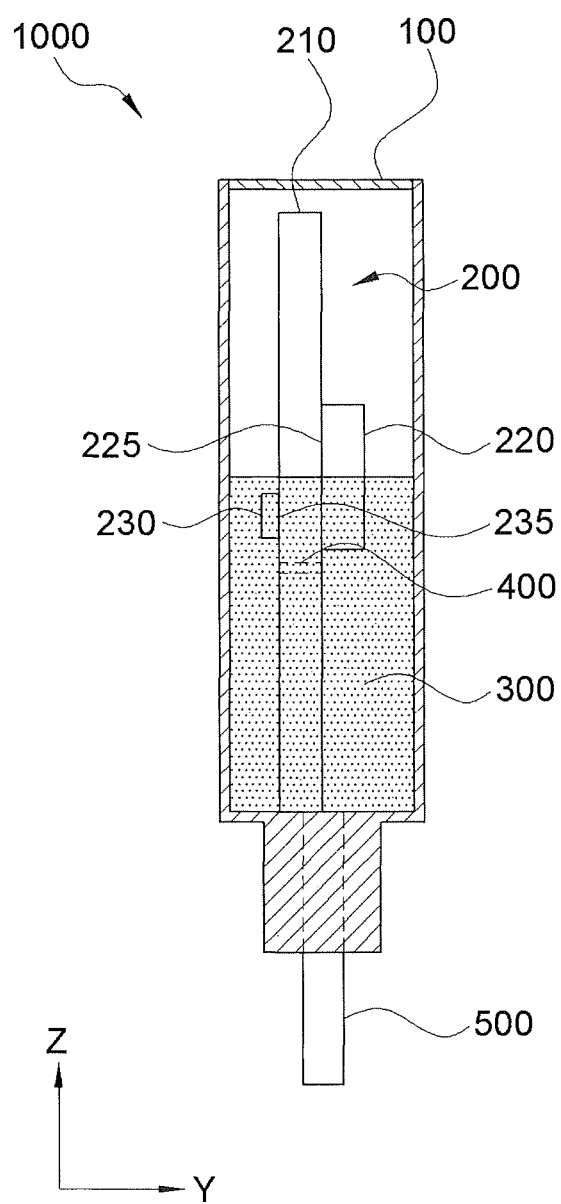
FIG. 2 is a schematic cross-sectional view of the electrical device according to an embodiment of the present invention.

FIG. 1 illustrates an entire perspective view of an electrical device 1000 according to an embodiment of the present invention and FIG. 2 illustrates a schematic cross-sectional view of the electrical device 1000 according to an embodiment of the present invention.

As illustrated below, it will be described by defining a direction in which the electrical device 1000 is coupled to an outlet as a Z direction, a direction perpendicular to the Z direction as an X direction, and a direction perpendicular to the Z direction and the X direction as the Y direction, and defining the Z direction as a length direction of the electrical device 1000, the X direction as a width direction, and the Y direction as a thickness direction. In addition, hereinafter, the invention will be described by dividing a positive direction of a Z axis to an upper side and a negative direction of the Z axis to a lower side, dividing a positive direction of a Y axis to one side and a negative direction of the Y axis to the other side, defining one end of a PCB as an end portion in the positive direction of the Z axis or an upper end portion of the PCB, and defining the other end of a PCB as an end portion in the negative direction of the Z axis or a lower end portion of the PCB.

For reference, the descriptions such as the vertical direction, the X axis, Y axis, and Z axis directions, and one end side and the other end side of the PCB, which are descriptions for indicating the direction, are only the descriptions for describing the invention on the basis of when the PCB is placed in the Z axis direction (vertical direction) perpendicular to a ground (XY plane) as illustrated in FIG. 2, and do not limit the scope of rights to the vertical direction and the like.

As illustrated, the electrical device 1000 includes a case 100, a PCB module 200, a filler 300, and a terminal pin 500. The case 100 has a shape of an enclosure having a space formed therein, and an upper side (a positive direction of the Z axis) is opened to accommodate the PCB module 200. In addition, the terminal pin 500 is coupled to a lower side (a negative direction of Z axis) of the case 100. Further, a cover 150 (see FIG. 9) may be coupled to an upper open surface of the case 100 so as to seal an internal space of the case 100.

Here, the case 100 may be formed of an insulating resin material, and may protect components accommodated therein from the outside. A plurality of insertion holes may be formed on the lower side of the case 100, and the terminal pin 500 may be inserted into the insertion holes to be fitted to the lower side of the case 100. The terminal pin 500 may be formed in the form of at least a pair of rods, in which an upper end thereof is inserted into the case 100 and is then accommodated in the case 100 and is electrically connected to the PCB module 200, and a lower end thereof is exposed to the outside of the case 100. Here, the terminal pin 500 may be formed of a conductive metal material, and the lower end exposed to the outside of the case 100 is configured to be inserted into an outlet to receive external power and transmit the external power to the PCB module 200 through the upper end. The PCB module 200 includes a plurality of components 220 and 230 and a PCB 210 on which solder bonding portions 225 and 235 are formed so that the components 220 and 230 are mounted.

At this time, the electrical device 1000 of the present invention includes a filler 300 formed in an internal space in which the PCB module 200 is accommodated. The filler 300 may have a viscosity higher than that of water, and may be formed in a cured form by filling the internal space of the case 100 with a resin material made of an insulating resin material. The filler 300 serves to insulate between the components mounted on the PCB module 200, to firmly fix the PCB module 200 on the case 100, and to disperse and dissipate heat from the components mounted on the PCB module 200 through heat conduction by close contact with the PCB module 200 and the case 100 to cool the components. The viscosity of the resin material may be 2,000 mPa-sec or more and 40,000 mPa-sec or less. If the viscosity is weak, a thickness of the filler 300 coated on the PCB module 200 becomes thin or a portion that is not coated may occur, resulting in a decrease in insulation or heat conduction efficiency, and if the viscosity is strong, there may be a problem in that a filling speed is lowered and the filling is not performed in a gap with a narrow area.

Meanwhile, the electrical device 1000 of the present invention includes the following characteristic configurations to prevent air pockets that may occur due to the shape of the PCB module 200 when filling the resin material, and to improve the flow performance of the resin material due to the PCB module 200.

A passage portion may be formed on the PCB module 200. The passage portion is configured so that the resin material or air (air pockets) that may be generated in the resin material penetrates and flows through one surface of the PCB 210 in a thickness direction (a positive direction of a Y axis) and the other surface thereof in the thickness direction (a negative direction of the Y axis). Accordingly, the passage portion includes a through hole 400 formed through one surface and the other surface of the PCB 210. The through hole 400 may be formed on the PCB 210 and may be formed on a first region in contact with the filler 300. At this time, since the air may be generated at a lower side of a protruding portion of the PCB module 200, that is, at a lower side of the components 220 and 230 mounted on the PCB module 200, the through hole 400 may be provided at a lower side than a component disposed at the lowermost side among the components 220 and 230. Therefore, when the component disposed at the lowermost side is mounted on one surface of the PCB 210, the air pocket generated at the lower side of the component disposed at the lowermost side may be guided to the other surface of the PCB 210 through the through hole 400 and discharged to the upper side of the filler 300. In addition, it is possible to shorten the filling time of the resin material by allowing the resin material introduced to the other surface of the PCB 210 to be quickly introduced into the lower side of the component disposed at the lowermost side of the one surface of the PCB 210 through the through hole 400.

In addition, a plurality of through holes 400 are formed to be spaced apart from each other, and a cross-sectional area thereof may be formed to be larger toward the lower side of the PCB 210 in order to improve fluidity. This is because flow resistance due to the PCB module 200 increases downward when filling the resin material. Additionally, the through holes 400 may be configured so that the number of through holes 400 formed along a horizontal direction increases as the through holes 400 are positioned at the lower side. That is, when a predetermined height on the case 100 is defined as a first height, in a case in which two through holes 400 are formed on the first height, three or more through holes 400 are formed on a second height lower than the first height, and one through hole 400 may be formed on a third height higher than the first height.

Further, the number of through holes 400 per unit area may increase or a cross section thereof may increase as a vertical length of the adjacent components 220 and 230 or a length protruding from the PCB 210 in the thickness direction increases. This is to further improve a discharge performance of the air pockets or a flow performance of the resin material by increasing the number of the through holes 400 or a cross-sectional area of the through holes 400 because the possibility of generating the air pockets increases and the flow resistance of the resin material increases as the size of the components 220 and 230 increases. Hereinafter, more specific and various embodiments of the PCB module including the through holes as described above will be described in detail with reference to the drawings.

First Embodiment

Figure 3:
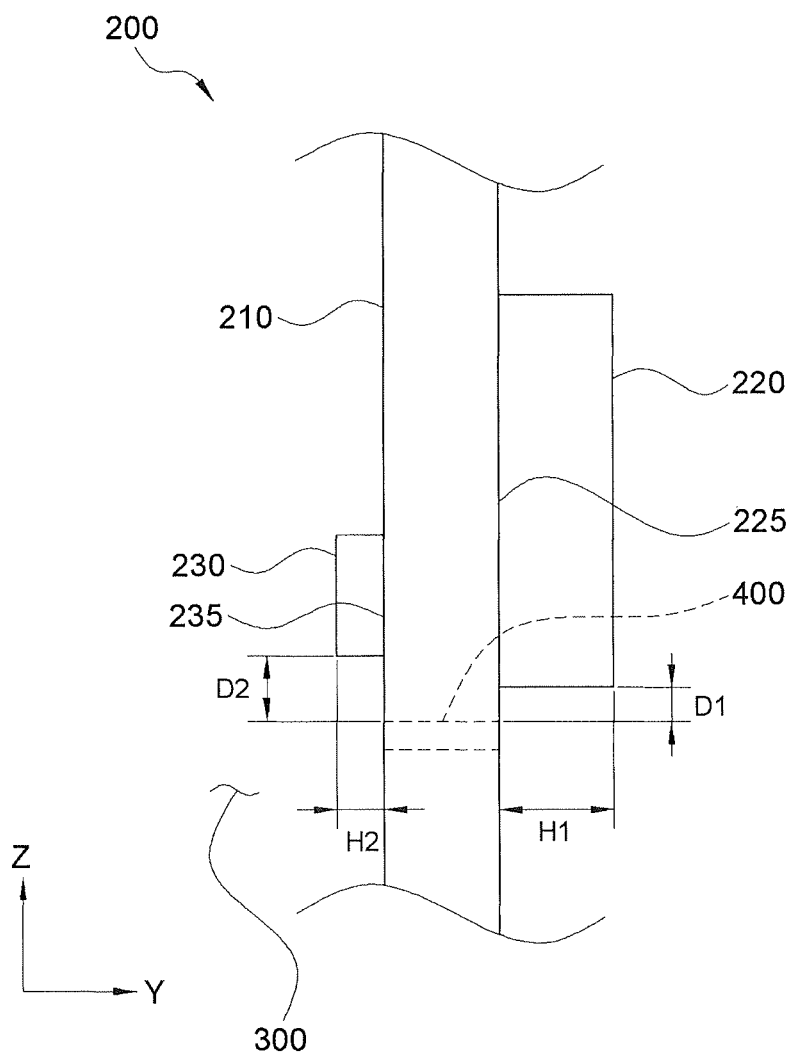
FIG. 3 is an enlarged cross-sectional view of a main part of an electrical device according to a first embodiment of the present invention.

FIG. 3 illustrates a partially enlarged cross-sectional view of the PCB module 200 of the electrical device according to a first embodiment of the present invention.

As illustrated, a first component group 220 may be mounted on the first bonding portion 225 formed on one surface of the PCB 210, and a second component 230 may be mounted on the second bonding portion 235 formed on the other surface of the PCB 210. In addition, the through hole 400 may be formed by being spaced apart by a predetermined distance from the lower end of the first component 220 to the lower side. In addition, the filler 300 may be formed to be in contact with one surface and the other surface of the PCB 210 at a predetermined height.

At this time, when a height of the first component 220 in the vertical direction of the PCB surface is H1, a separation distance of the first component 220 from the through hole 400 in the length direction is D1, a height of the second component 230 in the vertical direction of the PCB surface is H2, a separation distance of the second component 230 from the through hole 400 in the length direction is D2, and H1 of the first component 220 is equal to or greater than H2 of the second component 230, D1 of the first component 220 may be configured to be shorter than D2 of the second component 230.

That is, the air pockets generated at the lower end of the first component 220 on one side of the PCB 210 may be configured to be more easily discharged to the other side of the PCB 210 through the through hole 400 by disposing through hole 400 to be close to the first component having the high component height.

Second Embodiment

Figure 4:
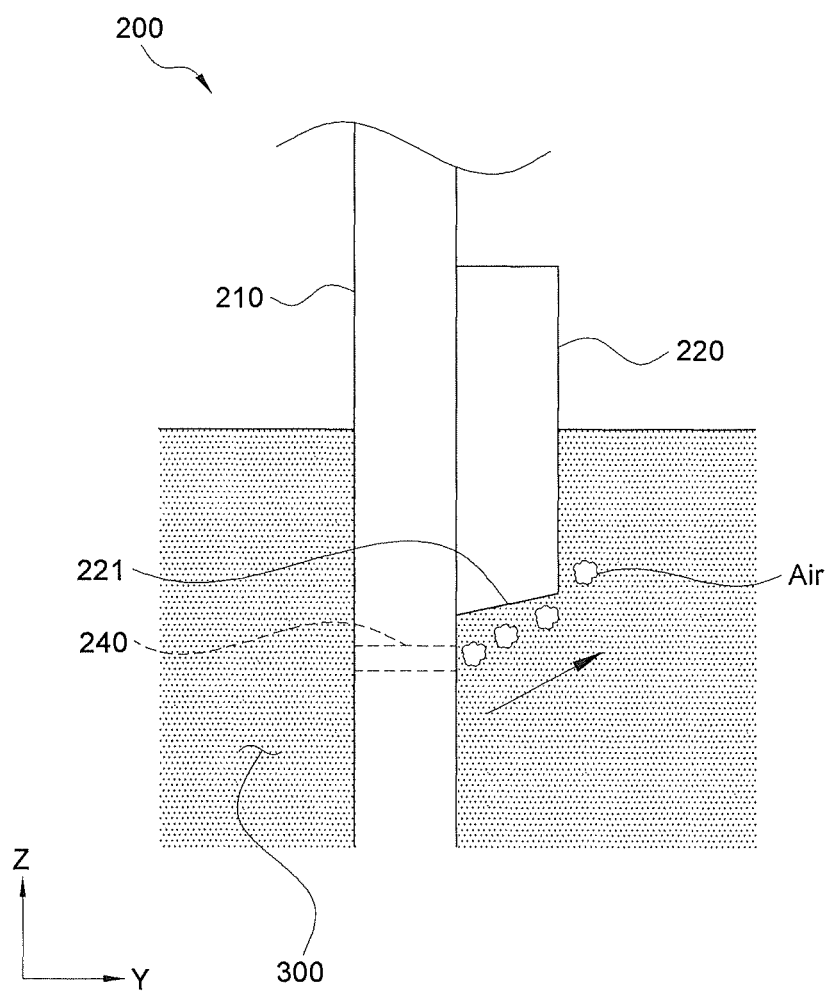
FIG. 4 is an enlarged cross-sectional view of a main part of an electrical device according to a second embodiment of the present invention.

FIG. 4 illustrates a partially enlarged cross-sectional view of the PCB module 200 according to a second embodiment of the present invention.

As illustrated, the first component 220 may be mounted on one surface of the PCB 210, and the through hole 400 may be formed by being spaced apart by a predetermined distance from the lower end of the first component 220 to the lower side. In addition, the filler 300 may be formed to be in contact with one surface and the other surface of the PCB 210 at a predetermined height.

At this time, the first component 220 may be formed to be inclined upward as a lower surface 221 thereof is further away from the PCB 210 in the thickness direction. Therefore, the air pockets (Air) may be easily discharged by allowing the air pockets (Air) generated at the lower side of the first component 220 to be guided upward along the lower surface 221 of the first component 220. In addition, the air pockets may be easily discharged by allowing the air pockets (Air) flowing from the other surface of the PCB 210 to one surface thereof through the through hole 400 to be also guided upward along the lower surface 221 of the first component 220. The lower surface 221 of the first component 220 may be formed in any shape as long as it is not a shape in which the air pockets may be stagnated, for example, a shape that is concave inward in the length direction. That is, the lower surface 221 of the first component 220 may be formed of a curved surface that is convex outward in a plane or in a length direction. In addition, the inclination of the lower surface 221 may also be made at any angle as long as it is an angle that may guide the air pockets upward.

Third Embodiment

Figure 5:
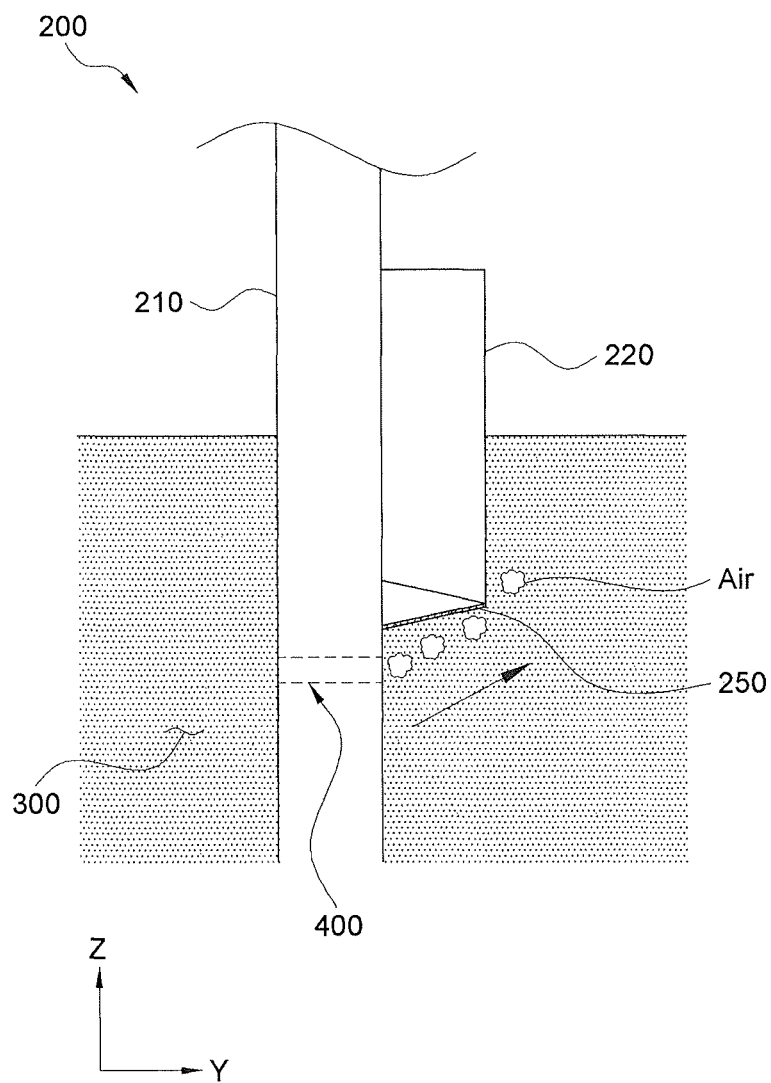
FIG. 5 is an enlarged cross-sectional view of a main part of an electrical device according to a third embodiment of the present invention.

FIG. 5 illustrates a partially enlarged cross-sectional view of the PCB module 200 according to a third embodiment of the present invention.

As illustrated, the first component 220 may be mounted on one surface of the PCB 210, and the through hole 400 may be formed by being spaced apart by a predetermined distance from the lower end of the first component 220 to the lower side. In addition, the filler 300 may be formed to be in contact with one surface and the other surface of the PCB 210 at a predetermined height.

When the lower surface of the first component 220 inevitably does not conform to the second embodiment, the PCB module 200 according to the present embodiment may be configured as follows.

The PCB module 200 may be provided with an air pocket prevention reinforcing agent 260 between the lower surface of the first component 220 and the upper end of the through hole 400. The reinforcing agent 260 has the other end in the thickness direction connected to the PCB 210, and one end in the thickness direction connected to the lowermost end on the lower surface of the first component 220 or the outermost in the thickness direction on the lower surface, and may be formed to be inclined upward as it is further away from the PCB 210 in the thickness direction.

Therefore, the air pockets may be easily discharged by allowing the air pockets (Air) generated at the lower side of the first component 220 to be guided upward along the reinforcing agent 260. In addition, the air pockets may be easily discharged by allowing the air pockets flowing from the other surface of the PCB 210 to one surface thereof through the through hole 400 to be also guided upward along the reinforcing agent 260. The reinforcing agent 260 may be formed in any shape as long as it is not a shape in which the air pockets may be stagnated, for example, a shape that is concave inward in the length direction. That is, the lower surface 221 of the first component 220 may be formed of a curved surface that is convex outward in a plane or in a length direction. In addition, the inclination of the reinforcing agent 260 may also be made at any angle as long as it is an angle that may guide the air pockets upward. The reinforcing agent 260 may be made of a material such as resin, polycarbonate (PC), or lead.

Fourth Embodiment

Figure 6:
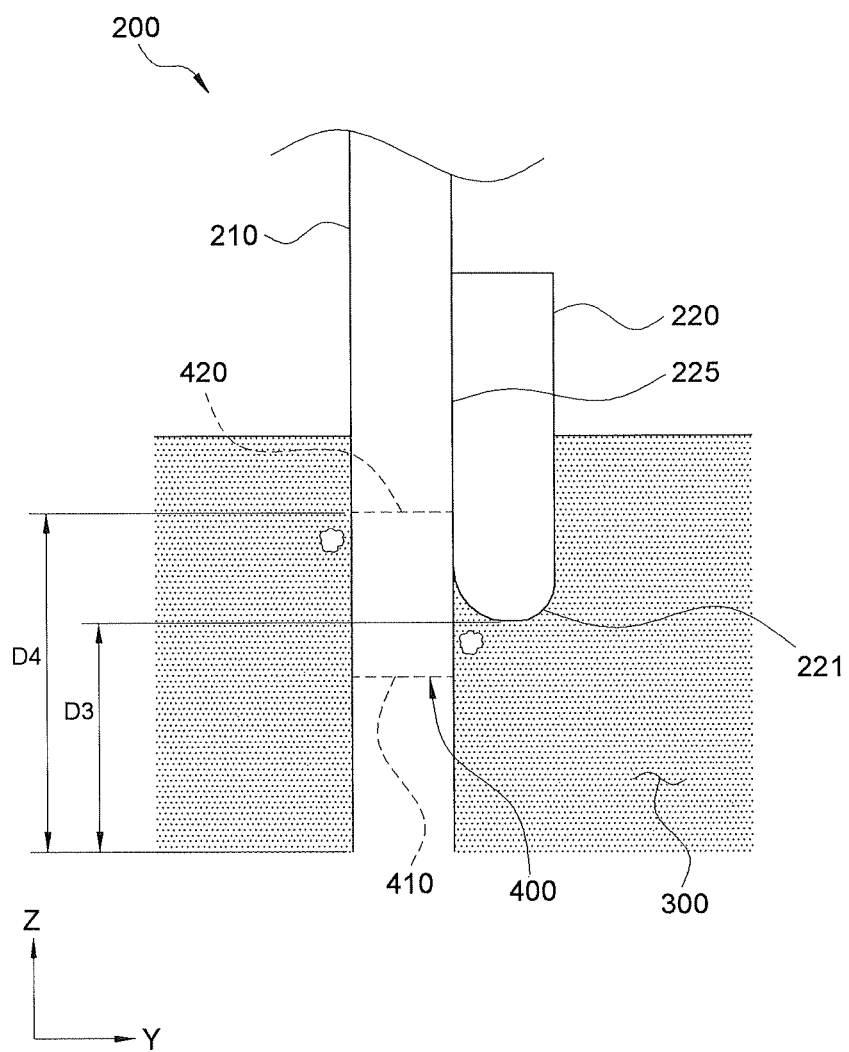
FIG. 6 is an enlarged cross-sectional view of a main part of an electrical device according to a fourth embodiment of the present invention.

FIG. 6 illustrates a partially enlarged cross-sectional view of the PCB module 200 according to a fourth embodiment of the present invention.

As illustrated, the first component 220 may be mounted on the first bonding portion 225 formed on one surface of the PCB 210, and the through hole 400 may be formed from the lower end of the first component 220 to the lower side. In addition, the filler 300 may be formed to be in contact with one surface and the other surface of the PCB 210 at a predetermined height.

At this time, in the through hole 400, the lowermost end 410 may be formed to be lower than the lowermost end of the first component 220, and the uppermost end 420 may be formed to be higher than the lowermost end of the first component 220. That is, the through hole 400 may be formed such that the lower end portion of the first component 220 is exposed along a penetration direction of the through hole 400. In particular, a distance D4 between the upper end of the through hole 400 and a specific height of the lower end of the PCB 210 may be longer than a distance D3 between the lower end of the first component 220 and the specific height of the lower end of the PCB 210.

According to the present embodiment, when the lower surface of the first component 220 is formed to be inclined downward from one surface of the PCB 210 toward one side in the thickness direction as illustrated and the through hole 400 is formed to be spaced apart from the first component 220 downward, the PCB module 200 is configured to prevent the air pockets generated at the lower side of the first component 220 from being not discharged through the through hole 400 and from being stagnated between the lower side of the first component 220 and the through hole 400.

Fifth Embodiment

Figure 7:
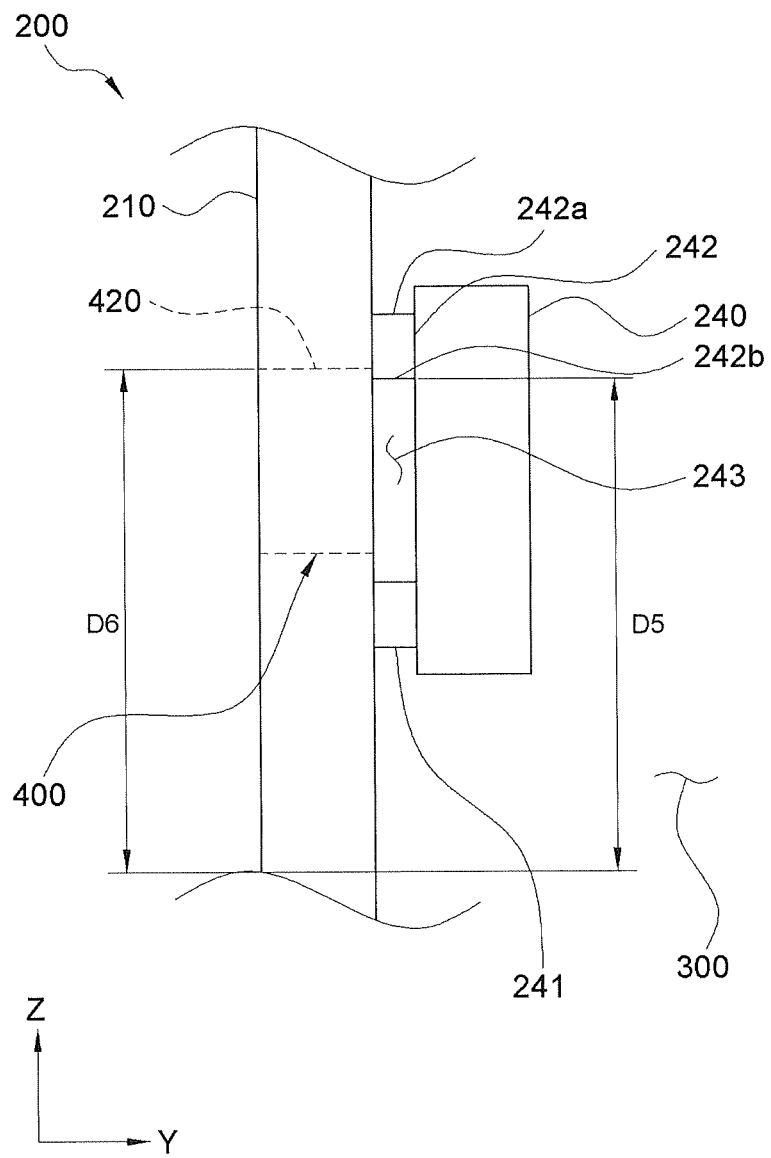
FIG. 7 is an enlarged cross-sectional view of a main part of an electrical device according to a fifth embodiment of the present invention.

FIG. 7 illustrates a partially enlarged cross-sectional view of the PCB module 200 according to a fifth embodiment of the present invention.

As illustrated, a third component 240 is mounted on one surface of the PCB 210, and includes first and second leg portions 241 and 242 soldered to the PCB 210 so that they are disposed to be spaced apart from each other in one side in the thickness direction on one surface of the PCB 210, and connecting the PCB 210 and the third component 240. The first and second leg portions 241 and 242 are disposed to be vertically spaced apart from each other, and may include a first leg portion 241 positioned at a lower side and a second leg portion 242 positioned at an upper side. In addition, the through hole 400 may be formed in the PCB 210 adjacent to the third component 240, and the filler 300 may be formed to be in contact with one surface and the other surface of the PCB 210 at a predetermined height.

At this time, the through hole 400 has the following characteristic configuration to prevent stagnation of the air pockets generated on a component separation space 243 between the first leg portion 241 and the second leg portion 242. That is, an upper end of the through hole 400 may be formed to be equal to or higher than a lower end of the second leg portion 242, and a lower end thereof may be formed to be equal to or higher than an upper end of the first leg portion 241.

In particular, a distance D6 between the upper end of the through hole 400 and a specific height of the lower end of the PCB 210 may be longer than a distance D5 between the lower end of the second leg portion 242 and the specific height of the lower end of the PCB 210.

Therefore, the PCB module 200 is configured so that the air pockets generated on the component separation space 243 may be smoothly discharged to the other surface of the PCB 210 through the through hole 400.

Sixth Embodiment

Figure 8:
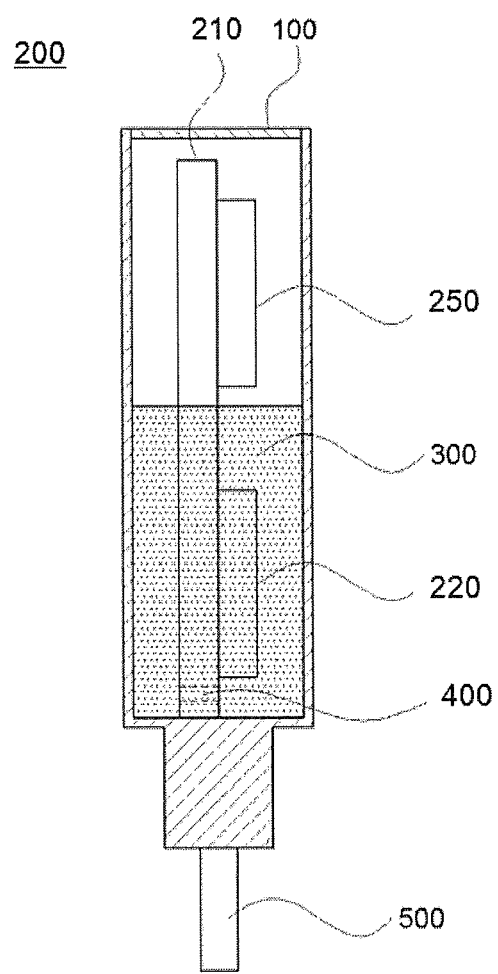
FIG. 8 is an enlarged cross-sectional view of a main part of an electrical device according to a sixth embodiment of the present invention.

FIG. 8 illustrates a partially enlarged cross-sectional view of the PCB module 200 according to a sixth embodiment of the present invention.

As illustrated, the first component 220 and a fourth component 250 may be mounted on one surface of the PCB 210, and the fourth component 250 may be formed on an upper side of the first component 220 to be spaced apart. In addition, the through hole 400 may be formed from the lower end of the first component 220 to the lower side, and the filler 300 may be formed to be in contact with one surface and the other surface of the PCB 210 at a predetermined height. At this time, the filler 300 is formed to be in contact with at least a partial region of the first component 220 and to be in non-contact with the fourth component 250. At this time, the amount of heat generation of the first component 220 is greater than that of the fourth component 250.

Therefore, by increasing a heat dissipation efficiency of the first component 220 through the filler 300, and preventing the fourth component 250, which has a relatively lower amount of heat generation than the first component group 220, from being radiated through the filler 300, heat generated from the fourth component 250 may be suppressed from being discharged through the case 100. The first component 220 may include, for example, a transformer or a semiconductor switch, and the fourth component 250 may include a capacitor.

In addition, a maximum allowable temperature of the fourth component 250 may be configured to be higher than a maximum allowable temperature of the first component 220. Therefore, the fourth component 250 is configured to ensure durability during heat generation even if heat is not radiated through the filler 300.

Further, the weight of the heaviest component among the first components 220 may be heavier than the weight of the heaviest component among the fourth components 250. This is to make the weight of the lower side of the case 100 relatively heavier than the upper side of the case 100 so as to impact the ground from the lower side of the electrical device having relatively high strength during a drop test.

Figure 9:
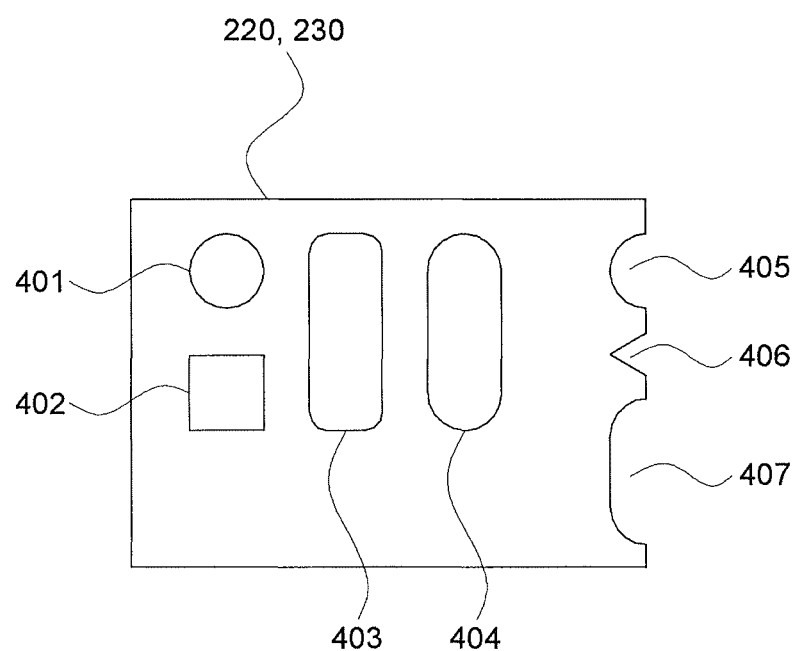
FIG. 9 is a side view of a PCB in which through holes are formed according to various embodiments of the present invention.

FIG. 9 illustrates a side view of the PCB 210 in which through holes 400 are formed according to various embodiments of the present invention. As illustrated, the through holes formed to penetrate through the PCB 210 may be through holes 401, 402, 403, and 404 in the form of a hole forming a closed curve, and may also be through holes 405, 406, and 407 in a form of a slit that is partially opened.

In addition, the shape of the through hole 400 may be a circular through hole 401, a polygonal through hole 402, or elliptical through holes 403 and 404.

In addition, at least a portion of the through hole 400 may also be used for at least one of insertion, fixing, and reverse insertion prevention of components such as an insulating member, a connector pin, and a transformer. More specifically, the through hole 400 may be a hole for fixing a position of a bobbin of a transformer or a line filter on the PCB or preventing reverse insertion when assembling to the PCB.

As an example, the through hole 400 may simultaneously include a region including a (metallic) soldering portion around a periphery to solder the component to the PCB, and a region that does not include the (metallic) soldering portion around the periphery so that the resin material or air contained in the resin material may pass through. As an example, a portion of one through hole may be soldered with a leg of the component penetrating through the PCB, and the other portion of the through hole may maintain a region that is not soldered and penetrated so that the resin material or air can pass through. To this end, the through hole may include a partition portion in which a cross-sectional area between the region for soldering and the resin material or air passage region is relatively narrowed.

As an example, as a vertical gourd bottle-shaped through hole, the through hole is in the shape of a gourd bottle, and a center thereof is slim, the top and bottom thereof are convex, an upper portion thereof is soldered with the leg of the component that penetrates including a metal foil around the periphery, and a lower portion thereof does not contain the metal foil around the periphery, such that the lower portion may not be soldered when soldering the component to the PCB. Therefore, the component is coupled to the PCB through the upper region of the through hole and air, which may be located at the lower end of the component, passes through the lower region of the through hole toward a surface opposite to the surface of the PCB to which the component is coupled, thereby making it possible to suppress the air-pockets.

With such a configuration, since the air pockets may be prevented by changing only the shape of the through hole for inserting the component without additionally configuring a separate air pocket prevention through hole, the degree of integration may be increased by using the PCB more efficiently.

As another example, as a horizontal gourd bottle-shaped through hole, the through hole is in the shape of a gourd bottle, and a center thereof is slim, the left and right thereof are convex, one side the left and right thereof is soldered with the leg of the component that penetrates including a metal foil around the periphery, and the other side thereof does not contain the metal foil around the periphery, such that the other side may not be soldered when soldering the component to the PCB. Although an air pocket suppression effect may be lower than that of the vertical gourd bottle-shaped through hole, the horizontal gourd bottle-shaped through hole may be formed when the vertical gourd bottle-shaped through hole may not be provided due to certain constraints such as component placement.

As still another example, as a diagonal gourd bottle-shaped through hole, the horizontal gourd bottle-shaped through hole may be provided at an angle inclined to the ground at a predetermined angle.

As an example, a portion of the through hole 400 accommodates the leg of the component to prevent the reverse insertion of the component into the PCB or fix the component to the PCB, and the other portion of the through hole may be a region through which the resin material or air may pass. To this end, the through hole may include a partition portion in which a cross-sectional area between the region for accommodating the leg of the component and the resin material or air passage region is relatively narrowed. As an example, the vertical, horizontal, or diagonal gourd bottle-shaped through hole may not include the metal foil around the periphery.

With such a configuration, since the air pockets may be prevented by changing only the shape of the through hole for inserting the component, fixing the component, and preventing the reverse insertion without additionally configuring a separate air pocket prevention through hole, the degree of integration may be increased by using the PCB more efficiently.

Hereinafter, a manufacturing method of an electrical device of the present invention configured as described above will be described with reference to the accompanying drawings.

Figure 10:
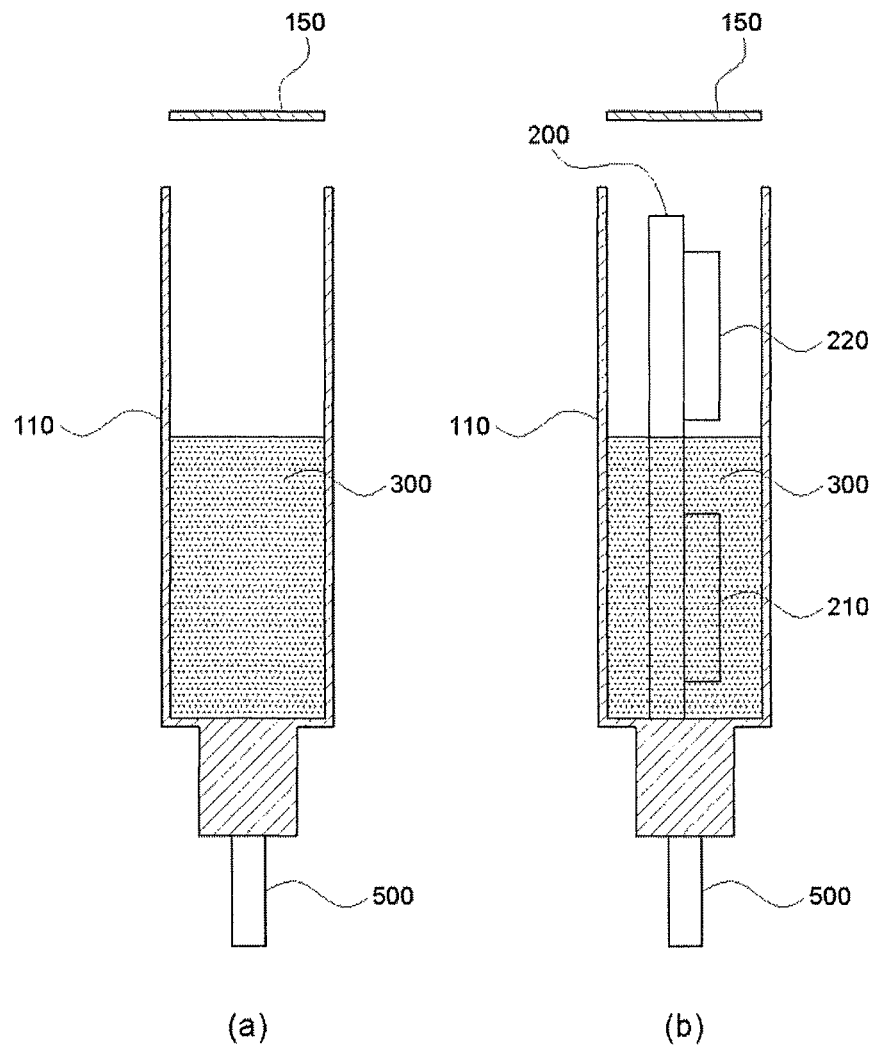
FIG. 10 is a schematic cross-sectional view of a manufacturing method of an electrical device according to the first embodiment of the present invention.

FIG. 10 is a schematic cross-sectional view illustrating a manufacturing method of an electrical device according to the first embodiment of the present invention.

First, as illustrated in FIG. 10A, a step of forming the filler 300 by injecting a resin material into the body 110 of the case 100 having an opened upper side and forming an internal space is performed.

Next, as illustrated in FIG. 10B, a step of accommodating the PCB module 200 in the body 110 on which the filler 300 is formed is performed. The PCB module 200 is divided into a first region in contact with the filler 300 and a region in which the filler 300 does not contact. In addition, when the PCB module 200 is accommodated, the lower end of the PCB module 200 may be electrically connected to the terminal pin 500.

At this time, when or after accommodating the PCB module 200, vibration is applied to the case 100 to more smoothly discharge the air pockets included in the filler 300 to the outside, and to improve fluidity of the resin material to be filled in the body 110.

In addition, when or after accommodating the PCB module 200, the case 100 may be tilted to more smoothly discharge the air pockets included in the filler 300 to the outside, and to improve fluidity of the resin material to be filled in the body 110. More preferably, by repeatedly tilting the case in one direction and the other direction for a predetermined number of times, the air pockets may be more smoothly discharged to the outside.

Next, the resin material is cured by maintaining the case 100 filled with the resin material at a predetermined temperature or higher. The predetermined temperature may be room temperature, preferably 50 to 200 degrees Celsius.

Finally, the cover 150 is coupled to the upper opening portion of the body 110 to seal the internal space of the body 110.

FIG. 11 is a schematic cross-sectional view illustrating a manufacturing method of an electrical device according to the second embodiment of the present invention.

First, as illustrated in FIG. 11A, a step of accommodating the PCB module 200 in the body 110 of the case 100 having an opened upper side and forming an internal space is performed. The PCB module 200 is divided into a first region in contact with the filler 300 and a region in which the filler 300 does not contact. In addition, when the PCB module 200 is accommodated, the lower end of the PCB module 200 may be electrically connected to the terminal pin 500.

Next, as illustrated in FIG. 11B, a step of forming the filler 300 by injecting the resin material into the body 110 in which the PCB module 200 is accommodated is performed. The filler 300 may be formed to be in contact with the first region.

At this time, when or after injecting the region material, vibration is applied to the case 100 to more smoothly discharge the air pockets included in the filler 300 to the outside, and to improve fluidity of the resin material to be filled in the body 110.

In addition, when or after injecting the resin material, the case 100 may be tilted to more smoothly discharge the air pockets included in the filler 300 to the outside, and to improve fluidity of the resin material to be filled in the body 110. More preferably, by repeatedly tilting the case in one direction and the other direction for a predetermined number of times, the air pockets may be more smoothly discharged to the outside.

Next, the resin material is cured by maintaining the case 100 filled with the resin material at a predetermined temperature or higher. The predetermined temperature may be room temperature.

Finally, the cover 150 is coupled to the upper opening portion of the body 110 to seal the internal space of the body 110.

The air-pocket prevention PCB, the air-pocket prevention module, the electrical device including the same, and the manufacturing method of the electrical device including the same according to the present invention having the configurations as described above may prevent the air pockets from being formed in the filler, thereby improving the fixing force and heat dissipation performance of the PCB module through the resin material.

Further, the manufacturing time may be shortened by allowing the resin material to be quickly and evenly filled inside the case and on the PCB module.

DETAILED DESCRIPTION OF MAIN ELEMENTS

1000: electrical device
100: case 110: body
150: cover
200: PCB module 210: PCB
220: first component 221: lower surface of first component
225: first bonding portion
230: second component 235: second bonding portion
240: third component 241: first leg portion
242: second leg portion 243 component separation space
250: fourth component
260: air-pocket prevention reinforcing agent
300: filler
400: through hole 410 lower end of through hole
420: upper end of through hole
500: terminal pin

What is claimed is:

1. An air-pocket prevention printed circuit board (PCB) module comprising:
   an air-pocket prevention PCB in which one end and the other end of the PCB are positioned opposite to each other and a portion of the PCB is provided at a position immerged in a resin material, wherein the air-pocket prevention PCB comprises a solder bonding portion for welding-soldering a component, and a passage portion including a through hole; and
   a plurality of components mounted on the solder bonding portion provided in plurality, wherein the through hole is provided on a first region immerged in the resin material and adjacent to the other end of the PCB, the through hole is spaced apart from a periphery of the PCB and penetrates through the PCB, wherein the plurality of components include a first component and a second component, and the first component is disposed on the first region of the PCB, and wherein the first component is disposed on one side of the through hole, and as a height of the first component increases, a cross-sectional area of the through hole increases.

2. An air-pocket prevention PCB module of claim 1, wherein the second component is disposed on a second region of the PCB other than the first region, and the amount of heat generation of the first component is greater than the amount of heat generation of the second component.

3. The air-pocket prevention PCB module of claim 1, wherein the through hole is disposed between the first component and the other end of the PCB.

4. The air-pocket prevention PCB module of claim 1, wherein a portion of the first component overlaps the through hole.

5. The air pocket prevention PCB module of claim 1, wherein the first component includes at least one of a transformer, a coil, a fuse, a varistor, and a capacitor.

6. The air-pocket prevention PCB module of claim 1, wherein the maximum allowable temperature of the components provided in the first region is lower than the maximum allowable temperature of any one of the components provided outside the first region.

7. The air-pocket prevention PCB module of claim 1, wherein the weight of the heaviest component among the components provided in the first region is heavier than the weight of the heaviest component among the components provided outside the first region.

8. The air-pocket prevention PCB module of claim 1, wherein the weight of the heaviest component among the components provided in the first region is heavier than the weight of the heaviest component among the components provided outside the first region.

9. The air-pocket prevention PCB module of claim 1, wherein the first component has a side surface that intersects with one surface of the PCB on which the first component is mounted and is adjacent to the through hole, and the side surface of the first component has an obtuse angle with respect to one surface of the PCB disposed between the side surface of the first component and the through hole.

10. The air-pocket prevention PCB module of claim 1, wherein the first component includes:

a body portion disposed on the PCB; and a first leg portion and a second leg portion interposed between the body portion and the PCB and spaced apart from each other, a portion of the first leg portion overlaps the through hole, and the second leg portion is disposed between the through hole and the other end of the PCB.

11. An air-pocket prevention printed circuit board (PCB) module comprising:

an air-pocket prevention PCB in which one end and the other end of the PCB are positioned opposite to each other and a portion of the PCB is provided at a position immerged in a resin material, wherein the air-pocket prevention PCB comprises a solder bonding portion for welding-soldering a component, and a passage portion including a through hole; and a plurality of components mounted on the solder bonding portion provided in plurality, wherein the through hole is provided on a first region immerged in the resin material and adjacent to the other end of the PCB, the through hole is spaced apart from a periphery of the PCB and penetrates through the PCB, wherein the plurality of components include a first component and a second component, and the first component is disposed on the first region of the PCB, and wherein the PCB includes a first surface and a second surface opposing each other, the first component is disposed on the first surface of the first region of the PCB, the second component is disposed on the second surface of the first region of the PCB, the first and second components are disposed on one side of the through hole, respectively, a first height of the first component is equal to or greater than a second height of the second component, and the first component is disposed closer to the through hole than the second component.

12. An air-pocket prevention printed circuit board (PCB) module comprising:

the air-pocket prevention PCB in which one end and the other end of the PCB are positioned opposite to each other and a portion of the PCB is provided at a position immerged in a resin material, wherein the air-pocket prevention PCB comprises a solder bonding portion for welding-soldering a component, and a passage portion including a through hole; and a plurality of components mounted on the solder bonding portion provided in plurality, wherein the through hole is provided on a first region immerged in the resin material and adjacent to the other end of the PCB, the through hole is spaced apart from a periphery of the PCB and penetrates through the PCB, wherein the plurality of components include a first component and a second component, and the first component is disposed on the first region of the PCB, and wherein the first component is disposed on one side of the through hole, the first component has a side surface that intersects with one surface of the PCB on which the first component is mounted and is adjacent to the through hole, the air-pocket prevention PCB module further includes a reinforcing agent on the side surface, and one surface of the reinforcing agent has an obtuse angle with respect to the one surface of the PCB disposed between the reinforcing agent and the through hole.

13. The air-pocket prevention PCB module of claim 12, wherein the air-pocket prevention reinforcing agent includes at least one of a resin, polycarbonate (PC), and lead.

* * * * *